United States Patent
Meyer et al.

(10) Patent No.: US 9,761,758 B2
(45) Date of Patent: Sep. 12, 2017

(54) SEMICONDUCTOR COMPONENT COMPRISING AN INTERLAYER

(71) Applicant: OSRAM Opto Semiconductors GmbH, Regensburg (DE)

(72) Inventors: Tobias Meyer, Regensburg (DE); Matthias Peter, Regensburg (DE); Jürgen Off, Regensburg (DE); Alexander Walter, Laaber (DE); Tobias Gotschke, Nittendorf (DE); Christian Leirer, Friedberg (DE)

(73) Assignee: OSRAM Opto Semiconductors GmbH (DE)

( * ) Notice: Subject to any disclaimer, the term of this patent is extended or adjusted under 35 U.S.C. 154(b) by 81 days.

(21) Appl. No.: 14/784,135

(22) PCT Filed: Apr. 17, 2014

(86) PCT No.: PCT/EP2014/057947
§ 371 (c)(1),
(2) Date: Oct. 13, 2015

(87) PCT Pub. No.: WO2014/173825
PCT Pub. Date: Oct. 30, 2014

(65) Prior Publication Data
US 2016/0079476 A1 Mar. 17, 2016

(30) Foreign Application Priority Data
Apr. 25, 2013 (DE) .................... 10 2013 104 192

(51) Int. Cl.
*H01L 33/00* (2010.01)
*H01L 33/32* (2010.01)
(Continued)

(52) U.S. Cl.
CPC ........ *H01L 33/325* (2013.01); *H01L 33/0025* (2013.01); *H01L 33/12* (2013.01); *H01L 33/025* (2013.01); *H01L 33/22* (2013.01)

(58) Field of Classification Search
CPC .................................................. H01L 33/22
See application file for complete search history.

(56) References Cited

U.S. PATENT DOCUMENTS

| 5,740,192 A | 4/1998 | Hatano et al. |
| 5,903,017 A * | 5/1999 | Itaya .................... B82Y 20/00 257/102 |

(Continued)

FOREIGN PATENT DOCUMENTS

| DE | 10 2008 028 345 A1 | 12/2009 |
| DE | 10 2009 060 749 A1 | 7/2011 |

(Continued)

OTHER PUBLICATIONS

Notice of Reasons for Rejection dated Oct. 25, 2016, of corresponding Japanese Application No. 2016-509408 in English.

(Continued)

*Primary Examiner* — Samuel Gebremariam
(74) *Attorney, Agent, or Firm* — DLA Piper LLP (US)

(57) ABSTRACT

An optoelectronic semiconductor component includes a layer sequence including a p-doped layer, an n-doped layer and an active zone that generates electromagnetic radiation arranged between the n-doped layer and the p-doped layer, wherein the n-doped layer includes at least GaN, an interlayer is arranged in the n-doped layer, wherein the interlayer includes $Al_xGa_{1-x}N$, wherein $0<x\leq1$, and the interlayer includes magnesium.

20 Claims, 5 Drawing Sheets

(51) Int. Cl.
*H01L 33/12* (2010.01)
*H01L 33/02* (2010.01)
*H01L 33/22* (2010.01)

(56) References Cited

U.S. PATENT DOCUMENTS

| | | | |
|---|---|---|---|
| 6,515,313 B1 | 2/2003 | Ibbetson et al. | |
| 2008/0096297 A1* | 4/2008 | Schiaffino | H01L 33/382 438/22 |
| 2011/0127489 A1* | 6/2011 | Lee | H01L 33/382 257/13 |

FOREIGN PATENT DOCUMENTS

| | | |
|---|---|---|
| JP | 2001-267692 | 9/2001 |
| JP | 2005-235912 | 9/2005 |
| JP | 2007-180499 | 7/2007 |

OTHER PUBLICATIONS

B. Beaumont et al., "Epitaxial Lateral Overgrowth of GaN," Physica Status Solidi B, vol. 227, No. 1, Jan. 9, 2001, pp. 11.

\* cited by examiner

SEMICONDUCTOR COMPONENT COMPRISING AN INTERLAYER

TECHNICAL FIELD

This disclosure relates to an optoelectronic semiconductor component and a method of producing such an optoelectronic semiconductor component.

BACKGROUND

DE 10 2009 060 749 A1 discloses an optoelectronic semiconductor component comprising a semiconductor layer sequence based on gallium nitride, indium gallium nitride, aluminum gallium nitride and/or indium aluminum gallium nitride. The semiconductor layer sequence comprises a p-doped layer sequence, an n-doped layer sequence and an active zone that generates light radiation, which is situated between the p-doped and n-doped layer sequences. Furthermore, the semiconductor layer sequence comprises at least one interlayer based on aluminum gallium nitride. The interlayer is situated at the same side of the active zone as the n-doped layer sequence and has a specific chemical permeability toward liquids having low viscosity which is less than a specific chemical permeability of regions of the semiconductor layer sequence that adjoin the interlayer.

It could therefore be helpful to provide a semiconductor component comprising an improved interlayer.

SUMMARY

We provide an optoelectronic semiconductor component including a layer sequence including a p-doped layer, an n-doped layer and an active zone that generates electromagnetic radiation arranged between the n-doped layer and the p-doped layer, wherein the n-doped layer includes at least GaN, an interlayer is arranged in the n-doped layer, the interlayer includes $Al_xGa_{1-x}N$, wherein $0<x\leq1$, and the interlayer includes magnesium.

We also provide a method of producing the semiconductor component, including producing a layer sequence including a p-doped layer, an n-doped layer and an active zone that generates electromagnetic radiation arranged between the n-doped layer and the p-doped layer, wherein the n-doped layer includes at least GaN, an interlayer is formed in the n-doped layer, the interlayer includes $Al_xGa_{1-x}N$, wherein $0<x\leq1$, and the interlayer includes magnesium, and wherein the interlayer is negatively doped, silicon or germanium is used in particular as negative dopant, and the negative dopant includes at least 1% of the concentration of magnesium.

We further provide an optoelectronic semiconductor component including a layer sequence including a p-doped layer, an n-doped layer, having a first layer, a second layer and an interlayer, and an active zone that generates electromagnetic radiation arranged between the n-doped layer and the p-doped layer, wherein the n-doped layer includes at least GaN, the first layer and the second layer are nitride-based, the first layer has holes, cracks and cutouts, the interlayer is arranged in the n-doped layer in between the first layer and the second layer, the interlayer includes $Al_xGa_{1-x}N$, wherein $0<x\leq1$, and the interlayer includes magnesium.

LIST OF REFERENCE SIGNS 1 carrier
2 first layer
3 hole
4 interlayer
5 second layer
6 active zone
7 p-doped layer
8 first electrical contact
9 second electrical contact
10 mirror layer
11 roughening
12 insulation layer
13 opening
14 second interlayer
15 contact layer

DETAILED DESCRIPTION

The semiconductor component includes an interlayer having a lower chemical permeability, wherein in particular the interlayer has improved lateral growth during deposition, as a result of which the impermeability of the interlayer is improved. As a result, holes are closed or reduced in size more efficiently.

This advantage is also achieved because the interlayer comprises magnesium, which supports lateral growth.

The interlayer may be positively doped. The positive doping results from the concentration of the dopant. As a result, a pn junction can be provided in the semiconductor component, the pn junction improving the electrical properties of the semiconductor component, for example.

The interlayer may be provided with a negative dopant and overall is negatively doped. As a result, it is possible to produce a current flow via the interlayer from an n-type contact to the active zone.

The negative dopant may be, for example, in the form of silicon and/or germanium. Preferably, the negative dopant can have at least 1% of the concentration of the positive dopant. On account of the increased activity of the negative dopant, in particular toward magnesium, this concentration suffices for a negative conductivity of the interlayer.

A second interlayer may be arranged in a manner spaced apart from the interlayer. The first and second interlayers are spaced apart from one another by a contact layer. The second interlayer can be analogously the first interlayer. By way of example, the conductivities of the first and second interlayers can differ, however. In particular, the second interlayer can be negatively doped and the first interlayer can be positively doped. Depending on the chosen structure, the first and second interlayers can also be identically doped or undoped.

An electrical contact may electrically conductively connect to the contact layer arranged between the two interlayers. In this way, it is possible to produce an electrically conductive connection from an electrical contact to the n-type side of the active zone.

A plated-through hole may be provided which is led through the p-type layer and the active zone to the n-type side of the semiconductor component, in particular to the contact layer. A compact construction of the semiconductor component can thus be achieved.

The interlayer may be arranged between an emission side of the semiconductor component and the active zone.

The magnesium doping may have a concentration of $5 \times 10^{18}$ per $cm^3$ to $1 \times 10^{21}$ per $cm^3$. In this way, during production of the interlayer, good lateral growth is achieved and cracks of the openings of the layer on which the interlayer is deposited are successfully closed as a result.

Thus, the interlayer has a high impermeability toward liquid chemicals, in particular toward liquids having a low viscosity. The interlayer thus has a lower chemical permeability than a further layer of the semiconductor component adjoining the interlayer. By way of example, the interlayer is less permeable toward nitric acid than a layer of the semiconductor component adjoining the interlayer.

A higher yield during manufacture and a higher reliability of the semiconductor components are achieved as a result. The interlayer ensures that hardly any or fewer liquid chemicals can penetrate into the semiconductor component during the processing of the semiconductor component.

The n-doped layer on which or in which the interlayer is formed can be formed, for example, as AlGaN, InGaN, AlInGaN and/or as a GaN layer. In particular, the n-doped layer can comprise a plurality of layers. In addition, the interlayer has the advantage that the yield is increased in particular during formation of electrical plated-through holes.

Depending on the structure chosen, the interlayer can be arranged between an electrical contact and the active zone in a current flow. In this example, the interlayer is negatively doped, but nevertheless comprises magnesium.

The above-described properties, features and advantages and the way in which they are achieved will become clearer and more clearly understood in association with the following description of the examples which are explained in greater detail in association with the drawings.

Figure 1:
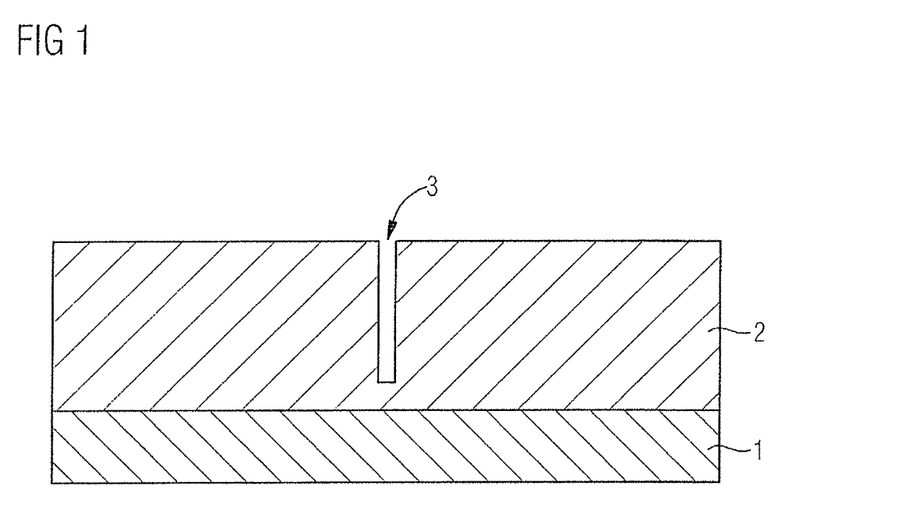
FIGS. 1 to 3 illustrate process steps of a method of depositing the interlayer.
Figure 2:
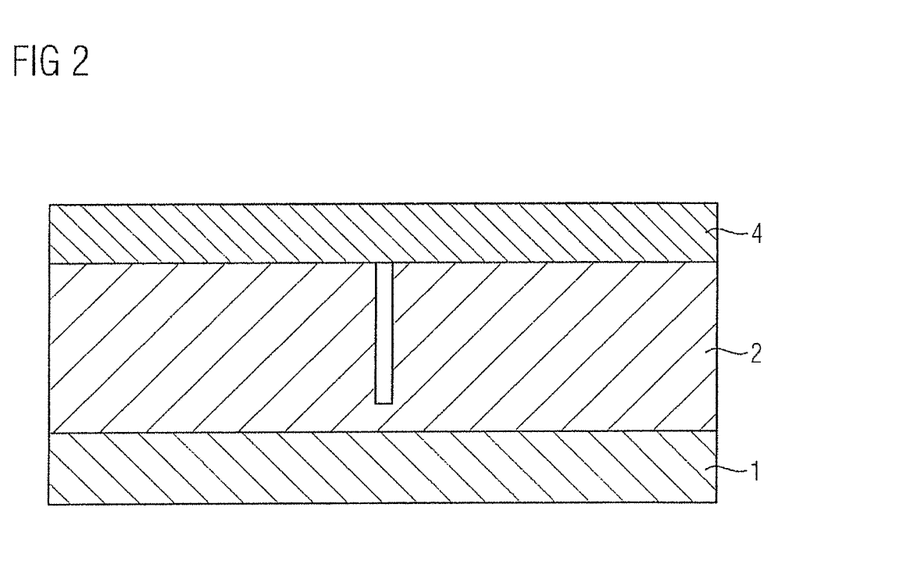
Figure 3:
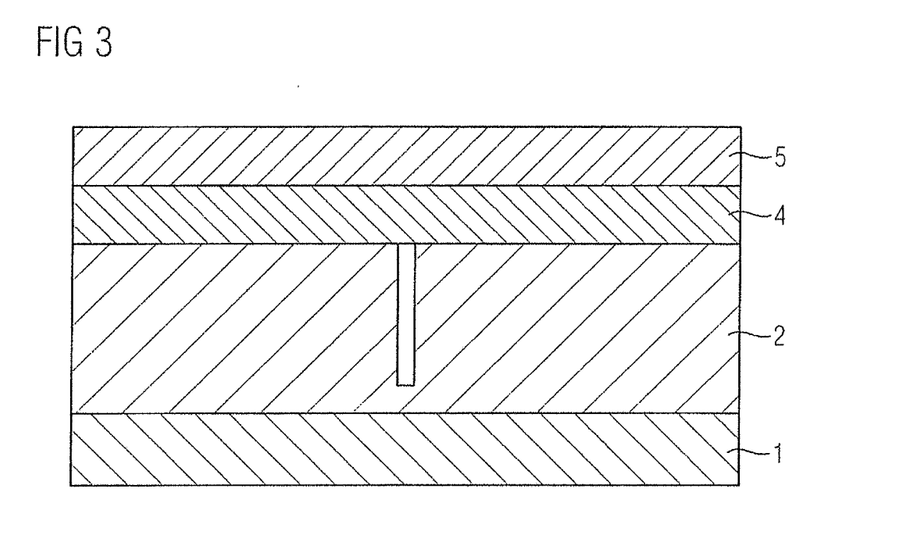

FIGS. 1 to 3 schematically show essential steps of producing an interlayer.

In FIG. 1, a first layer 2 is applied to a carrier 1. The carrier 1 is formed from sapphire, for example. Other materials can also be used instead of sapphire. The first layer 2 constitutes a nitride-based layer which comprises, for example, gallium nitride, indium gallium nitride, aluminum gallium nitride and/or indium aluminum gallium nitride, in particular is a gallium nitride layer, an indium gallium nitride layer, an aluminum gallium nitride layer and/or an indium aluminum gallium nitride layer. The first layer 2 can, for example, be grown epitaxially, for example, with the aid of an MOVPE method. Holes 3 can form in the first layer 2, the holes being negative for the further process implementation. Only one hole 3 is illustrated in the example illustrated. In actual fact, a plurality of holes, cracks, cutouts or the like can be formed in the first layer 2 and extend as far as the surface or close to the surface.

Afterward, in a further method step, illustrated in FIG. 2, an interlayer 4 is applied to the first layer 2. The interlayer 4 is in the form of an interlayer based on $Al_xGa_{1-x}N$, wherein the concentration of aluminum can assume values of x between greater than 0 and 1. In addition, the interlayer 4 is provided with magnesium, which supports lateral growth. The lateral growth of the interlayer 4 is supported by magnesium such that the hole 3 hardly continues further and preferably does not continue further at all in the interlayer 4. The interlayer 4, adjoining the first layer 2, has a homogeneous, impermeable and substantially defect-free surface structure. In a subsequent method step, illustrated in FIG. 3, a second layer 5 is applied to the interlayer 4. The second layer 5 can correspond to the first layer 2.

In addition to magnesium, provision can also be made of silicon, germanium, calcium and/or indium in the interlayer 4. Depending on the chosen structure, the interlayer 4 can be negatively doped, in particular with silicon or germanium. Depending on the chosen concentration of the dopant or dopants, the interlayer 4 is substantially undoped, positively doped or negatively doped.

The first layer 2, the interlayer 4 and the second layer 5 can constitute an n-type side of an optoelectronic semiconductor component adjoining an active zone. The active zone generates electromagnetic radiation. A p-type layer that contacts the active zone is formed opposite the n-type side of the active zone. In the following figures, various possible examples of a semiconductor component are described, although they are not exhaustive.

Figure 4:
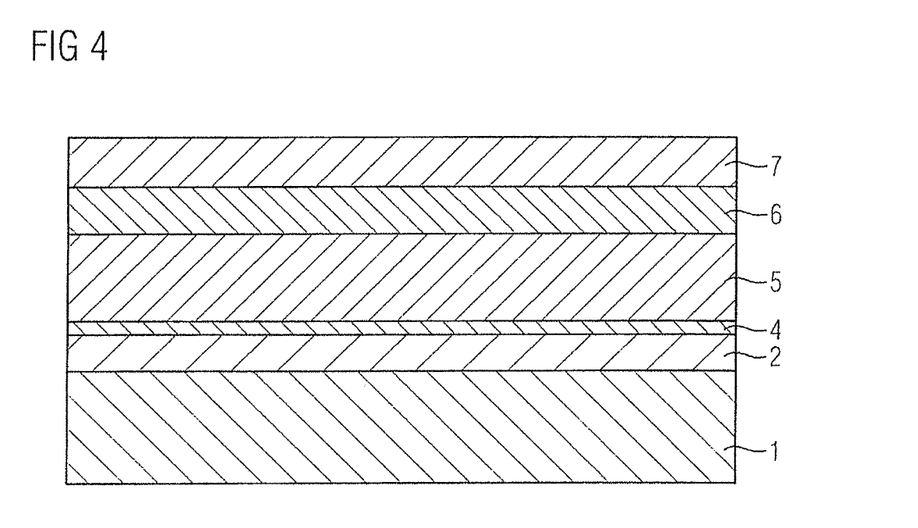
FIG. 4 illustrates a first basic structure of a semiconductor component.

FIG. 4 shows a first basic structure of a semiconductor component comprising a carrier 1 on which a first layer 2 is applied. An interlayer 4 is applied on the first layer 2. A second layer 5 is applied on the interlayer 4. The first layer 2 corresponds, for example, to the first layer 2 in FIG. 3. The interlayer 4 corresponds, for example, to the interlayer 4 in FIG. 3. The second layer 5 corresponds, for example, to the second layer 5 in FIG. 3.

An active zone 6 is applied on the second layer 5. The active zone 6 generates electromagnetic radiation. In this case, the active zone can have, for example, a quantum well structure of arbitrary dimensionality, preferably a plurality of quantum well structures. By way of example, ultraviolet radiation, blue or green light is generated in the active zone 6 during operation of the semiconductor component.

A p-doped layer 7 is applied on the active zone 6. The p-doped layer 7 is based, for example, on gallium nitride, indium gallium nitride, aluminum gallium nitride and/or indium aluminum gallium nitride, or in particular a gallium nitride, indium gallium nitride, aluminum gallium nitride and/or indium aluminum gallium nitride layer.

Figure 5:
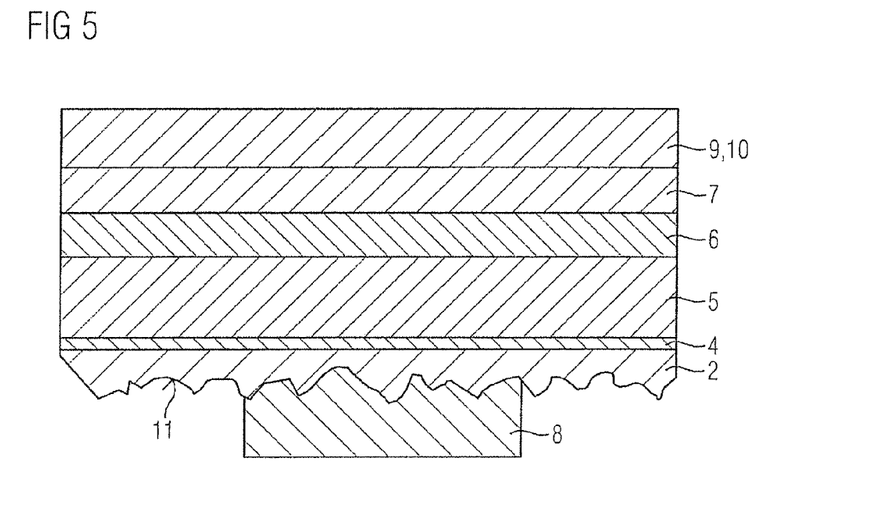
FIG. 5 illustrates a first example of a semiconductor component.

From the basic structure in FIG. 4, by removing the carrier 1 and roughening 11 that side of the first layer 2 facing the carrier 1, applying a first electrical contact 8, applying a mirror layer 10 to the p-doped layer 7 and applying a second electrical contact 9 to the mirror layer 10, it is possible to obtain a first semiconductor component as illustrated in FIG. 5. Depending on the chosen structure, the mirror layer 10 can, for example, be formed from a silver layer and formed in or adjoining the second electrical contact 9. The carrier 1 is removed by a laser lift-off method, for example. In addition, the roughening 11 is produced by an etching process. In the example in FIG. 5, the interlayer 4 is not mechanically severed. The roughening 11 is formed on the first layer 2 opposite to the interlayer 4. Liquid chemicals such as, e.g., KOH are used for removal of the carrier 1 and the roughening 11. Penetration of the liquid chemicals into the second layer 5 is securely and reliably avoided by the interlayer 4. The roughening 11 improves coupling-out of the electromagnetic radiation and is arranged on the side via which the semiconductor component, which is an LED, emits radiation.

Figure 6:
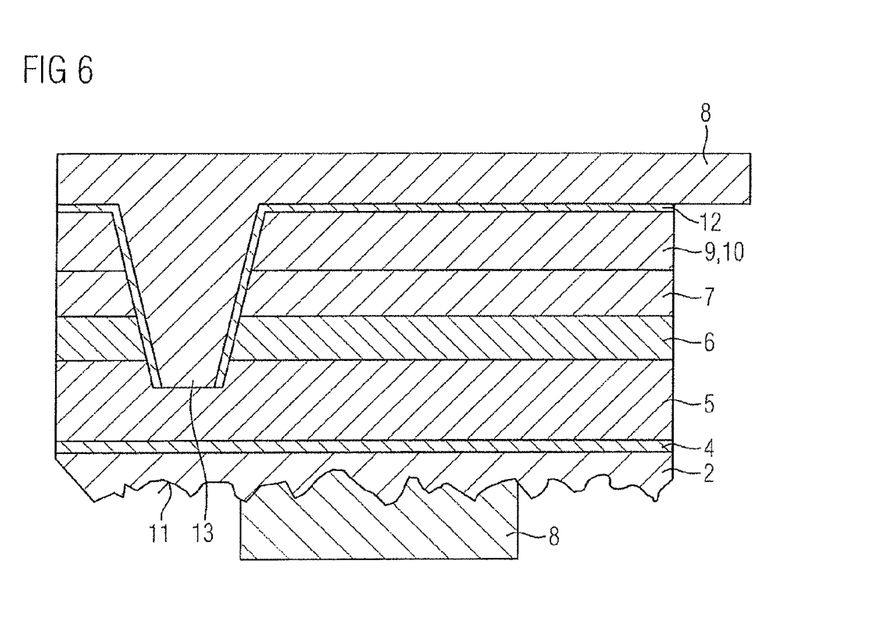
FIG. 6 illustrates a further example of a semiconductor component.

FIG. 6 shows a further example produced on the basis of the basic structure in FIG. 4. In this case, the carrier 1 was removed and the free side of the first layer 2 was subsequently provided with a roughening 11. In addition, a mirror layer 10 and a second electrical contact 9 were applied to the p-type layer 7. The mirror layer 10 can also be dispensed with or the mirror layer 10 and the second electrical contact 9 are one layer. This also applies to FIG. 5.

In addition, the mirror layer 10, the second electrical contact 9, the p-type layer 7, the active zone 6 adjoining as far as the second layer 5 were provided with an opening 13. An insulation layer 12 is applied to the sidewalls of the opening 13 and to the top side of the second electrical contact 9. The insulation layer 12 can be shaped, for example, from a transparent material such as silicon dioxide or silicon nitride. Afterward, a first electrical contact 8 is applied to the insulation layer 12 and introduced into the opening 13 adjoining the second layer 5. In the example in FIG. 6, the current flow that operates the active zone 6 is not passed via the interlayer 4. In this example, the interlayer 4 can be negatively doped, but also undoped or positively doped, even though the interlayer 4 is formed in the n-doped second layer 5.

The interlayer 4 has, for example, a magnesium concentration of $5 \times 10^{18}$ per $cm^3$ to $5 \times 10^{20}$ per $cm^3$, in particular $5 \times 10^{19}$ per $cm^3$.

The interlayer 4 can have a thickness of 15 nm to 250 nm, for example. In addition, the aluminum concentration can have the value x of 0.03 to 0.5.

Figure 7:
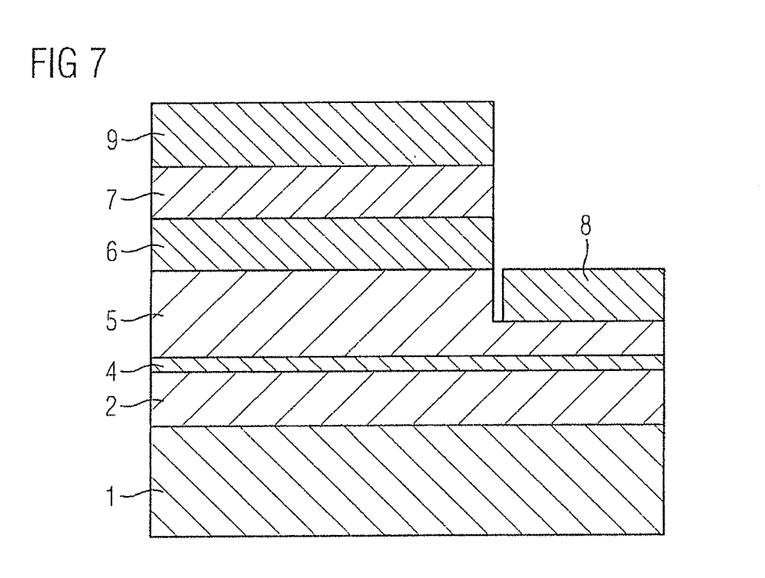
FIG. 7 illustrates a further example of a semiconductor component.

FIG. 7 shows a further example of a semiconductor component which has been produced proceeding from the basic structure in FIG. 4. In this example, the carrier 1 was not removed. Parts of the p-doped layer 7 and the active zone 6 were removed. Afterward, a first electrical contact 8 was applied to the second layer 5. In addition, a second electrical contact 9 was applied to the p-doped layer 7. In this example, the interlayer 4 can be undoped, positively doped or else negatively doped with silicon or germanium, for example.

Figure 8:
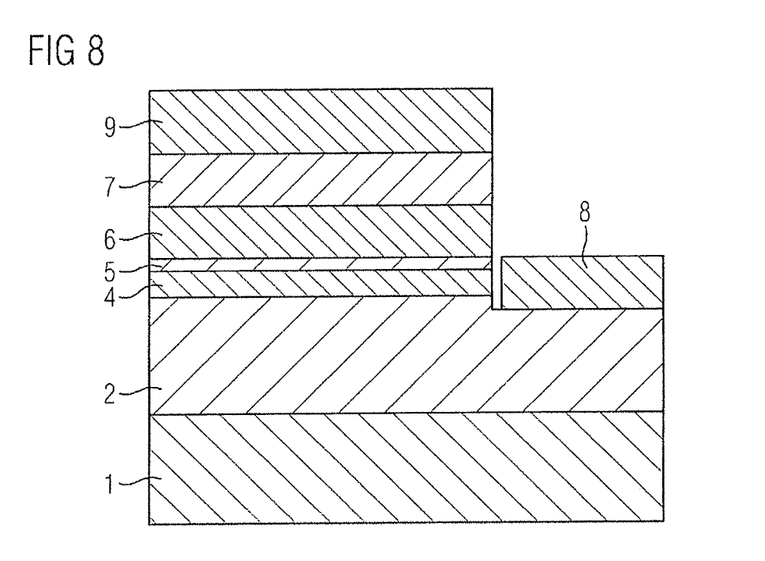
FIG. 8 illustrates a further example of a semiconductor component.

FIG. 8 shows a further example produced from the basic structure in FIG. 4. In this case, in contrast to the example in FIG. 7, the second layer 5 and the interlayer 4 were also removed in a partial region in addition to the p-doped layer 7 and the active zone 6. Afterward, the first electrical contact 8 was applied to the first layer 2. In addition, a second electrical contact 9 was applied to the p-doped layer 7. In this example, the interlayer 4 is negatively conductively doped, for example, by silicon or germanium. In addition, the interlayer 4 comprises magnesium, however. In this example, the current that operates the active zone 6 is conducted through the interlayer 4.

Figure 9:
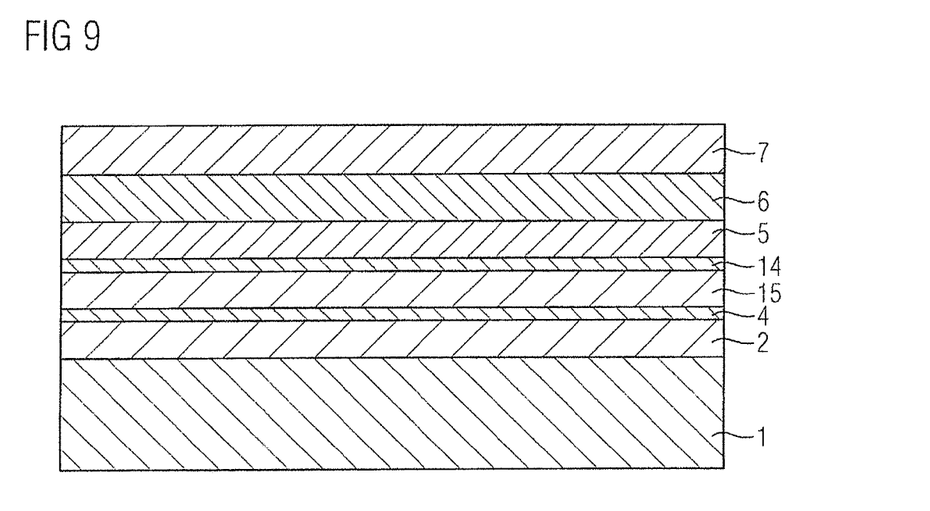
FIG. 9 illustrates a second basic structure.

FIG. 9 shows a further basic structure substantially corresponding to the basic structure in FIG. 4, but a second interlayer 14 is provided in addition to the interlayer 4, the second interlayer likewise being formed in the n-doped layer sequence. The second interlayer 14 is spaced apart from the interlayer 4 by a negatively doped contact layer 15. In addition, the second layer 5 is arranged between the second interlayer 14 and the active zone 6. The interlayer 4 and the second interlayer 14 can be identical, for example, as explained with reference to FIG. 3 or 4.

The contact layer 15 is formed, for example, from the same material as the first layer 2 or the second layer 5. The contact layer 15 can have an increased negative doping. By way of example, the doping of the contact layer 15 can be $1 \times 10^{18}/cm^3$ to $1 \times 10^{22}/cm^3$. In particular, the negative doping of the second contact layer 15 can be higher than the negative doping of the second layer 5.

Furthermore, in the example illustrated, the interlayer 4 can be negatively doped, undoped or positively doped. The second interlayer 14 is negatively doped and comprises magnesium. The second interlayer 14 can also be without magnesium. In this example, protection of the negatively doped layers 15, 5 against chemicals is realized only by the interlayer 4. The second interlayer 14 can be used, for example, as endpoint detection for a via etch. A mass spectrometer that identifies the occurrence of Al during etching of the opening 13 is used for this purpose.

Figure 10:
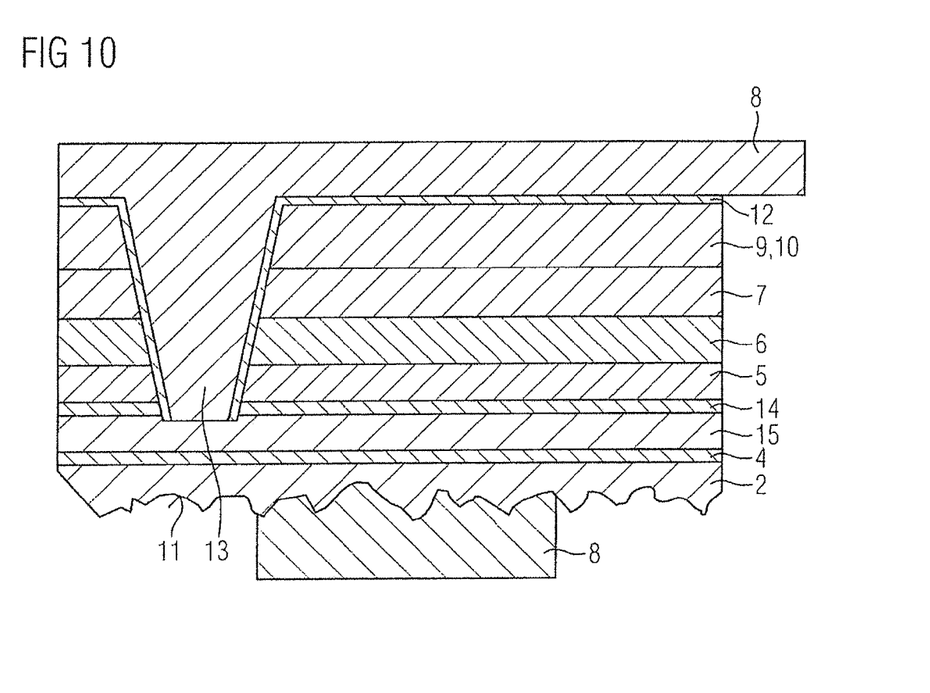
FIG. 10 illustrates a further example of a semiconductor component.

FIG. 10 shows one example of a semiconductor component which was constructed on the basic structure in FIG. 4. In this case, the carrier 1 was removed and the exposed side of the first layer 2 was roughened. In addition, a second electrical contact 9 and preferably a mirror layer 10 were applied to the p-doped layer 7. In addition, an opening 13 was introduced through the second electrical contact 9, the mirror layer 10, the p-doped layer 7, the active zone 6, the second layer 5 and the second interlayer 14 as far as the contact layer 15. Afterward, an insulation layer 12 was applied to the side surfaces of the opening 13 and to the top side of the mirror layer 10 and of the second electrical contact 9. A first electrical contact 8 was thereupon applied to the insulation layer 12 and introduced into the opening 13 in a manner adjoining as far as the contact layer 15.

The interlayer 4 is not severed and has, for example, a doping with magnesium of $5 \times 10^{19}$ per $cm^3$.

In the interlayer 4 and/or in the second interlayer 14 the proportion x of gallium lattice sites occupied by aluminum atoms can have a value of 0.03 to 0.2 or 0.03 to 0.5, preferably 0.07 to 0.13, for example, a value in the region of 0.1.

The interlayer 4 and/or the second interlayer 14 can have a thickness of 5 nm to 50 nm or 15 nm to 200 nm, in particular 25 nm to 100 nm.

The semiconductor layers of the semiconductor component are at least partly, in particular all, grown epitaxially.

The thickness of the interlayer 4 and/or of the second interlayer 14 is preferably 15 nm to 500 nm, in particular 25 nm to 150 nm. The interlayers 4, 14 are based on aluminum gallium nitride, wherein, for example, a proportion of 3% to 20%, in particular approximately 10% of the gallium lattice sites are occupied with aluminum atoms compared to pure gallium nitride.

The interlayer 4 in the examples in FIGS. 5, 6 and 10, in which the interlayer 4 is formed in a manner adjoining the roughening 11, can also be completely removed by a corresponding etch. In these examples, the roughening 11 is formed at the second layer 5 or by the contact layer 15.

Although our components have been more specifically illustrated and described in detail by the preferred examples, nevertheless this disclosure is not restricted by the examples disclosed and other variations can be derived therefrom by those skilled in the art, without departing from the scope of protection of the appended claims.

This disclosure claims the priority of DE 102013104192.2, the disclosure of which is hereby incorporated by reference.

The invention claimed is:

1. An optoelectronic semiconductor component comprising a layer sequence comprising a p-doped layer, an n-doped layer and an active zone that generates electromagnetic radiation arranged between the n-doped layer and the p-doped layer, wherein the n-doped layer comprises at least GaN, an interlayer is arranged in the n-doped layer, the interlayer comprises $Al_xGa_{1-x}N$, wherein $0<x\leq1$, and the interlayer comprises magnesium.

2. The semiconductor component according to claim 1, wherein the interlayer is positively doped and the concentration of magnesium is $5\times10^{18}/cm^3$ to $1\times10^{21}/cm^3$.

3. The semiconductor component according to claim 1, wherein the interlayer comprises a negative dopant.

4. The semiconductor component according to claim 3, wherein the negative dopant is silicon or germanium in an amount of at least 1% relative to an amount of magnesium.

5. The semiconductor component according to claim 3, wherein the interlayer is arranged along a current flow between a p-type contact and an n-type contact.

6. The semiconductor component according to claim 1, further comprising a second interlayer provided in the n-doped layer in a manner spaced apart from the interlayer by a contact layer, wherein the second interlayer comprises an $Al_xGa_{1-x}N$ layer, wherein $0<x\leq1$, and is negatively doped with silicon, and the contact layer connects to an n-type contact.

7. The semiconductor component according to claim 1, wherein an n-type contact in the form of a plated-through hole is led through the p-type layer and the active zone to a contact layer, and the contact layer is arranged between the active zone and the interlayer.

8. The semiconductor component according to claim 1, wherein the interlayer is arranged between an emission side and the active zone.

9. The semiconductor component according to claim 1, wherein the concentration of magnesium is $5\times10^{18}/cm^3$ to $1\times10^{21}/cm^3$.

10. The semiconductor component according to claim 1, wherein the interlayer is positively doped.

11. The semiconductor component according to claim 1, wherein the interlayer is negatively doped.

12. A method of producing a semiconductor component according to claim 1, comprising producing a layer sequence comprising a p-doped layer, an n-doped layer and an active zone that generates electromagnetic radiation arranged between the n-doped layer and the p-doped layer, wherein the n-doped layer comprises at least GaN, an interlayer is formed in the n-doped layer, the interlayer comprises $Al_xGa_{1-x}N$, wherein $0<x\leq1$, and the interlayer comprises magnesium.

13. The method according to claim 12, wherein the interlayer is negatively doped, silicon or germanium is used in particular as negative dopant, and the negative dopant comprises at least 1% of the concentration of magnesium.

14. The method according to claim 12, further comprising forming a second interlayer in the n-doped layer in a manner spaced apart from the interlayer by a contact layer, wherein the second interlayer comprises an $Al_xGa_{1-x}N$ layer and is negatively doped, and the contact layer connects to an n-type contact.

15. The method according to claim 12, wherein the n-type contact in the form of a plated-through hole is led through the p-type layer and the active zone.

16. The method according to claim 12, wherein the concentration of magnesium is $5\times10^{18}/cm^3$ to $1\times10^{21}/cm^3$.

17. The method according to claim 12, further comprising removing the interlayer by an etching process.

18. The semiconductor component according to claim 1, wherein the interlayer has a thickness of 15 nm to 200 nm.

19. The semiconductor component according to claim 1, further comprising another layer adjoining the interlayer, wherein the interlayer has a lower chemical permeability than the another layer.

20. An optoelectronic semiconductor component comprising a layer sequence comprising:
a p-doped layer;
an n-doped layer, having a first layer, a second layer and an interlayer; and
an active zone that generates electromagnetic radiation arranged between the n-doped layer and the p-doped layer,
wherein the n-doped layer comprises at least GaN,
the first layer and the second layer are nitride-based,
the first layer has holes, cracks and cutouts,
the interlayer is arranged in the n-doped layer in between the first layer and the second layer,
the interlayer comprises $Al_xGa_{1-x}N$, wherein $0<x\leq1$, and
wherein the interlayer comprises magnesium.

* * * * *